United States Patent
Raimi et al.

[19]

[11] Patent Number: 6,131,080

[45] Date of Patent: Oct. 10, 2000

[54] METHOD OF MONITORING A COMPUTER SIMULATION OF AN ELECTRICAL CIRCUIT

[75] Inventors: Richard S. Raimi; Javier Prado; James S. Golab, all of Austin, Tex.

[73] Assignee: Motorola, Inc., Schaumburg, Ill.

[21] Appl. No.: 09/135,049

[22] Filed: Aug. 17, 1998

[51] Int. Cl.[7] .................................................. G06F 17/50
[52] U.S. Cl. .................................................. 703/14; 716/6
[58] Field of Search ................................... 703/14; 716/6

[56] References Cited

U.S. PATENT DOCUMENTS

| | | | |
|---|---|---|---|
| 5,648,909 | 7/1997 | Biro et al. | 716/6 |
| 5,657,239 | 8/1997 | Grodstein et al. | 716/6 |
| 5,675,728 | 10/1997 | Kunda et al. | 714/28 |
| 5,812,416 | 9/1998 | Gupte et al. | 716/2 |
| 5,943,498 | 8/1999 | Yano et al. | 717/4 |

OTHER PUBLICATIONS

Palnitkar et al.: Finite state machine trace analysis program; IEEE Veilog HDL Conf.; pp. 52–57, 1994.

*Primary Examiner*—James P. Trammell
*Assistant Examiner*—Hugh Jones
*Attorney, Agent, or Firm*—Lee E. Chastain

[57] ABSTRACT

A simulation monitor (502) automatically generates a monitor file (510) from a static timer output file (504). The monitor file instantiates a function, a firing equation, that triggers if and only if a critical timing path also triggers. The monitor file is written in a high level language description, suitable for efficient simulation. The test vectors which trigger the firing equation can thereby be monitored and used for hardware test at a later time. The invention may be extended to monitor other conditions of interest.

19 Claims, 10 Drawing Sheets

METHOD OF MONITORING A COMPUTER SIMULATION OF AN ELECTRICAL CIRCUIT

FIELD OF THE INVENTION

The present invention relates generally to integrated circuit design and more particularly to the design and test of integrated circuits.

BACKGROUND OF THE INVENTION

The use of computer aided design (CAD) tools in the development of complex digital circuit designs is firmly established in the semiconductor industry. Without CAD tools, it would simply be impossible to manage the myriad of connections in a design having well in excess of one million transistors.

CAD tools have other specific advantages. For instance, most CAD tools allow designers to specify a design in terms of its function in an intuitive syntax. This syntax is often referred to as a high level design synthesis language (HDL), or simply a high level language. Statements written in such a language are similar to statements written in common high level computer programming languages, such as BASIC, C, C++, FORTRAN, etc. Also, the operation of circuits described in a high level language can be readily simulated by a computer to test their proper operation prior to manufacture. In the case of a simulation, a series of input bits, or "test vectors" is applied to the simulator. The simulator generates output bits, or "output vectors" which are compared to expected results. Later, an automatic logic synthesizer will convert the high level language code into a specific combination of gates and latches that performs the same function as does the high level language code. This methodology removes many opportunities for error from human hands. It should be noted that there is typically very little resemblance between the high level and low level representations of a design. This dissimilarity makes it very difficult if not impossible to associate high level and low level signals.

Static timing tools are specific CAD tools that identify paths, or connections of nodes, in a design through which a signal propagates with some computed delay. Static timing tools parse the gate level representation of a circuit and estimate the propagation time through every possible path. Typically, static timing programs operate best on circuits expressed at a low level of detail. Conceptually, there is no prohibition against the operation of static timing programs on high level language descriptions of electrical circuits. Designers have empirically discovered that the maximum speed of a circuit may be disproportionately increased by careful attention to a small subset of electrical paths in the circuit. Once identified, these critical "speed paths" can be redesigned to perform better.

"False paths" complicate the use of timing tools. False paths are timing paths that can never be exercised during normal operation of a circuit. Other design constraints often make it impossible for a particular path to fire in a particular way. However, current design and test methodologies make it difficult to associate a speed path with any set of vectors that would exercise the path. Therefore, it is difficult for a human to evaluate whether a path is false or not. Furthermore, the complexity of most designs makes it computationally difficult to determine if a path is false or not. Therefore, it is difficult even for an automated process executing on a computer to identify a false path.

In general, it is very difficult to associate a test vector with the exercise of any particular path in a complex design. This complexity arises whether the path is a speed path or otherwise. Consequently, designers frequently chose to apply millions of test vectors to a model and later to the actual circuit to test the design's proper operation. Such an approach is both inefficient and non-deterministic.

It may be desirable to monitor the propagation of signals through a chosen path for reasons other than timing requirements. Again, the size and complexity of modern designs makes this a difficult task.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION

Figure 1:
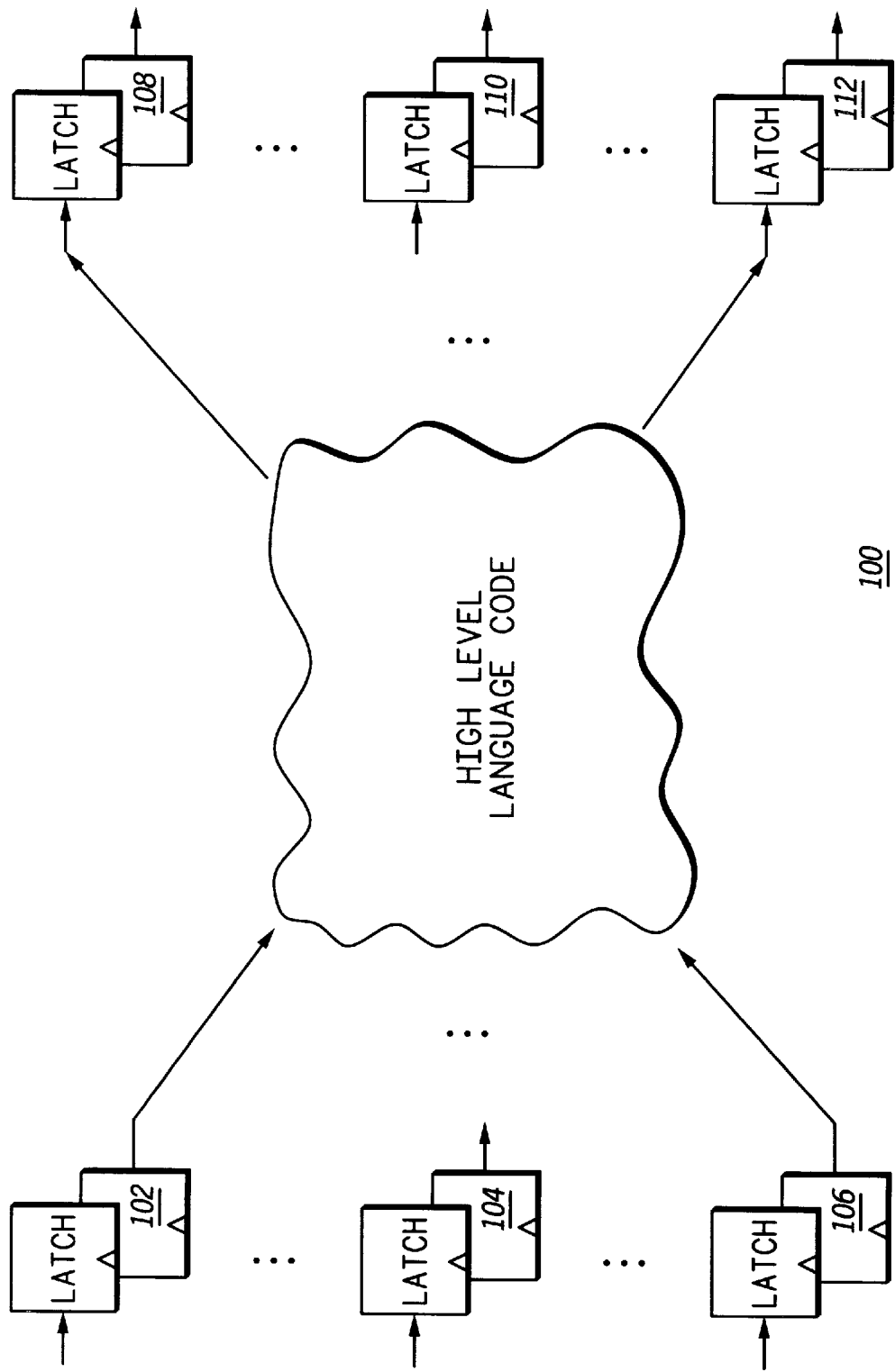
FIG. 1 is a partial block, partial schematic diagram of a circuit represented in a high level language, useful in the explanation of the present invention.
Figure 2:
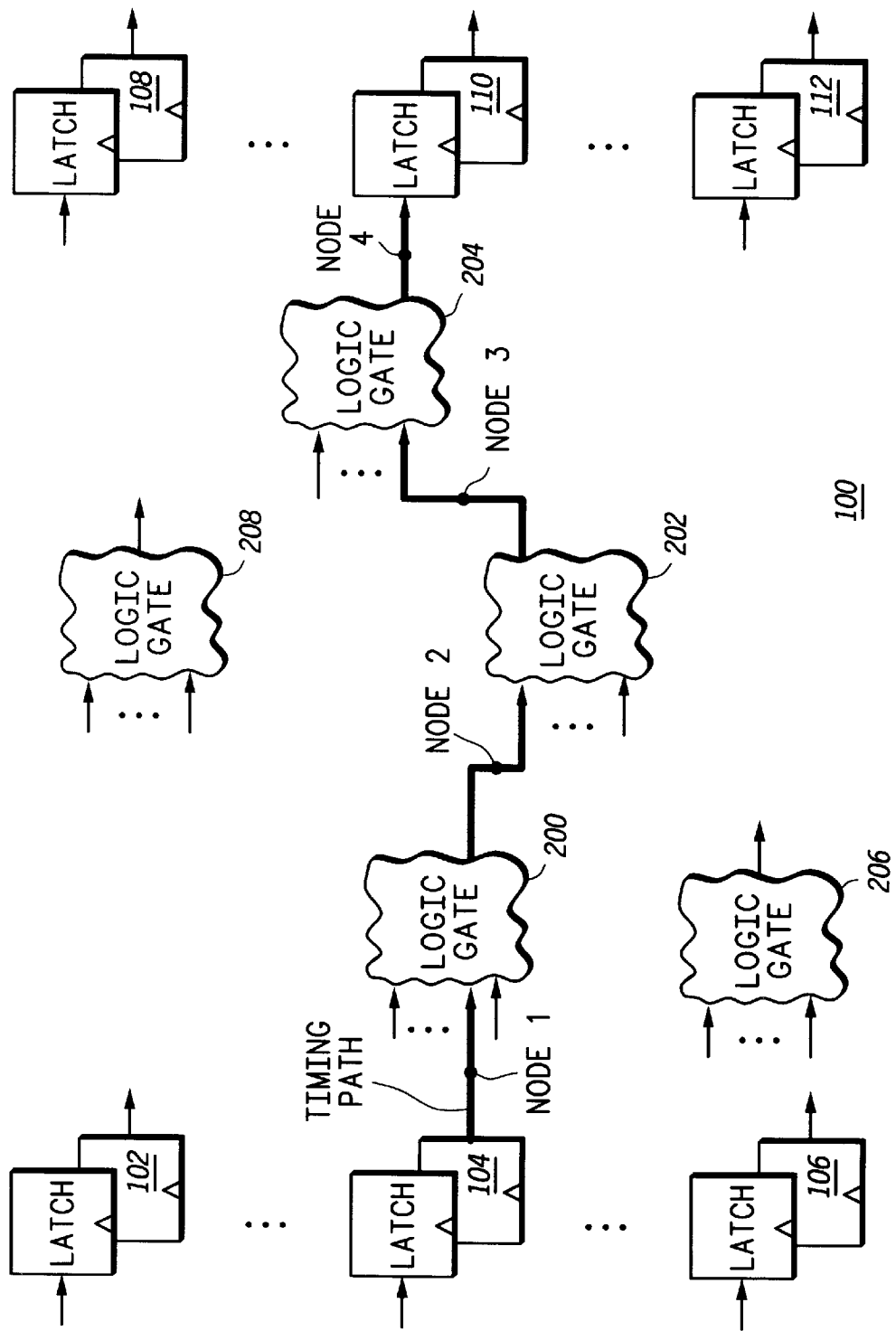
FIG. 2 is a partial block, partial schematic diagram of the circuit illustrated in FIG. 1 in a low level language.

FIG. 1 is a partial block, partial schematic diagram of a circuit 100 represented in a high level language, useful in the explanation of the present invention. A plurality of inputs to circuit 100 are connected to differing ones of latches 102, 104, and 106. The outputs of latches 102, 104, and 106 are logically combined according to specific high level language code to generate a plurality of outputs. The outputs are latched by a plurality of latches 108, 110, and 112. A designer specifies the operation of circuit 100 according to a high level language because of the language's ease of use. Also, the operation of circuits described in a high level language can be readily simulated by a computer to confirm their proper operation prior to manufacture. Later, an automatic logic synthesizer will convert the high level language code into a specific combination of gates in a low level language that performs the same function as does the high level language code. This design stage is depicted in FIG. 2 and is used to manufacture circuit 100. Invariably, speed paths will limit the maximum frequency at which latches 102, 104, 106, 108, 110, and 112 operate.

The present invention creates a simulation model, or "firing equation," that triggers upon the propagation of an electrical signal through a chosen path. A simulation monitor generates the firing equation starting from the output of a static timing tool and from a low level language description of the circuit. The firing equation itself is expressed in terms of a high level language. This equation can be combined and simulated simultaneously with the model of the electrical circuit. The simulator calculates the value of the firing equation as it calculates the value of every other signal in the simulation model when test vectors are applied to the combined model. In this way, the existence of false paths can be better known. If the firing equations reveal that a certain path is used, then the designer knows that he must modify the speed path or suffer degraded performance of his design.

Furthermore, the designer can note the test vectors that caused the firing equation to trigger. Typically, designers use automated programs to generate millions of test vectors which are applied to the circuit model during simulation. Prior to the disclosed invention, it was nearly impossible to associate any one of these millions of test vectors with the exercise of a particular path. Now, the firing equations signal which specific test vectors exercise the particular path. The designer can easily collect these vectors. Later after manufacture, the designer can apply the same test vectors to the physical circuit to efficiently test the speed path.

For purposes of illustrating the present invention, references hereafter describe firing equations that monitor speed paths. One skilled in the art, in conjunction with the instant specification, will readily appreciate how the present invention may be extended to monitor other events of interest. For instance, the path could be chosen because it represents an impermissible operation, it is a performance monitor, etc. The specific discussion that follows is not intended to limit the scope of the appended claims to a particular use of the invention.

FIG. 2 is a partial block, partial schematic diagram of circuit 100 illustrated in FIG. 1 in a low level language. Here, the high level language code illustrated in FIG. 1 has been converted by a logic synthesizer into a low level language description of the same circuit. Generally, such a description will include a set of nodes, NODE 1, NODE 2, NODE 3, and NODE 4, serially connected by logic gates, here logic gates 200, 202, and 204. One skilled in the art will readily appreciate that FIG. 2 only depicts one electrical path through circuit 100. Typically, many other paths are defined in circuit 100. The presence of logic gates 206 and 208 are depicted to illustrate these other connections. Furthermore, logic gates 200, 202, and 204 receive other inputs than the single input depicted connected to each logic gate.

As described above, circuit 100 will usually have one or a group of electrical paths which are predicted to be slower by a static timing tool than all other paths. For purposes of illustrating the invention, one such path, labeled TIMING PATH, is depicted by the bold connection from latch 104 to latch 110: via NODE 1, logic gate 200, NODE 2, logic gate 202, NODE 3, logic gate 204, and NODE 4. In addition to identifying the TIMING PATH(s), a static timing program will also provide the particular logic transitions (high-to-low or low-to-high) which cause the path to be slow. The disclosed invention simulates a circuit that generates a response when the values of NODE 1, NODE 2, NODE 3, and NODE 4 simultaneously transition as prescribed by the static timing tool.

Figure 3:
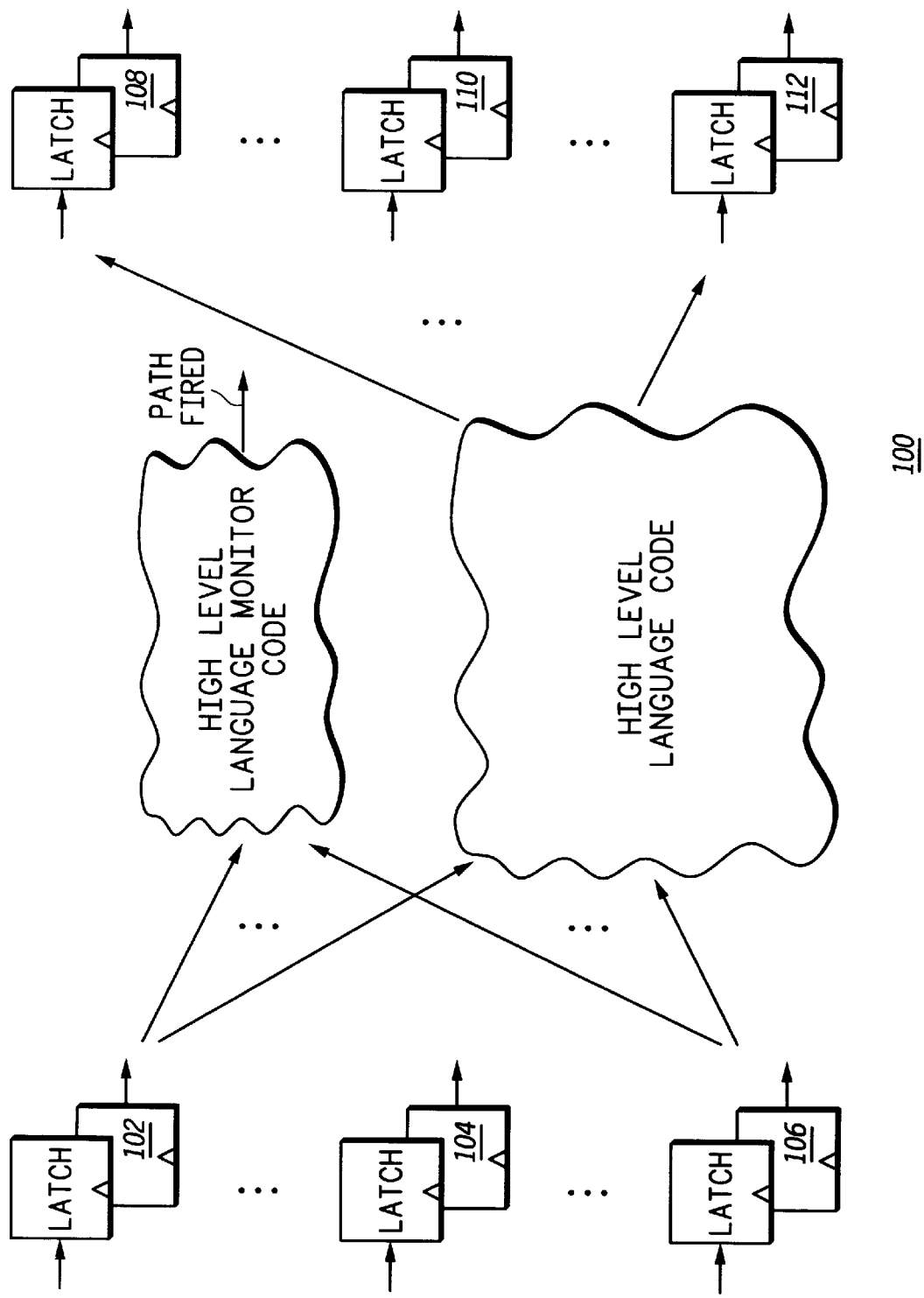
FIG. 3 is a partial block, partial schematic diagram of the circuit illustrated in FIG. 1 to which the present invention has been applied.

FIG. 3 is a partial block, partial schematic diagram of circuit 100 illustrated in FIG. 1 to which the present invention has been applied. According to the present invention, a simulation monitor (depicted in FIG. 5) generates high level language monitor code. This monitor code receives as inputs some or all of the inputs to the high level language code and generates an output PATH FIRED. In the depicted example, the high level language monitor code receives the outputs of latches 102, 104, and 106 because these are the inputs to the high level language code. In other circuits, the high level language code receives the outputs of latches, primary inputs to circuit 100, and the outputs of unsynthesized circuits such as memory blocks or standard design macros. The monitor code asserts PATH FIRED when NODE 1, NODE 2, NODE 3, and NODE 4 simultaneously transition as prescribed by the static timing tool. In other designs it is possible to have more than one speed path in a particular circuit or subcircuit. In these cases, the monitor code generates a unique PATH FIRED signal for each timing path.

Figure 4:
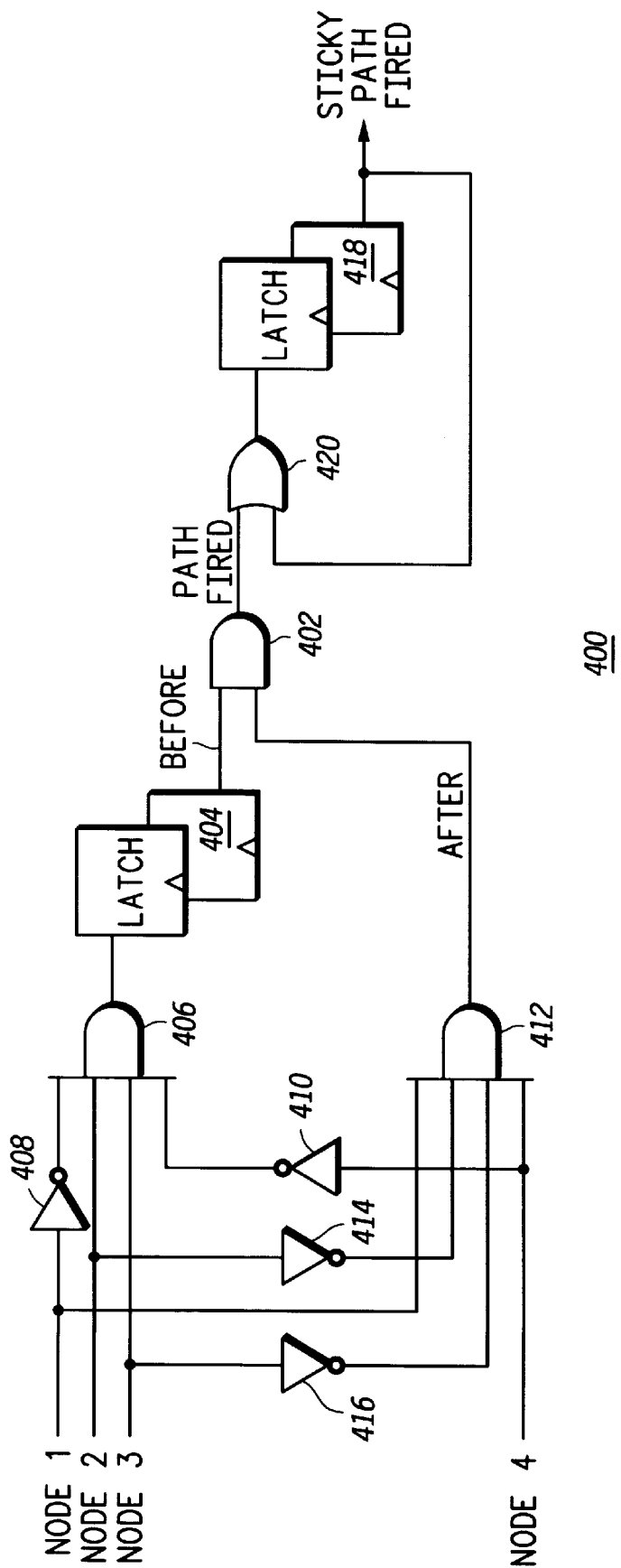
FIG. 4 is a schematic diagram of the high level language monitor code illustrated in FIG. 3.

FIG. 4 is a schematic diagram 400 of the high level language monitor code illustrated in FIG. 3. Diagram 400 represents the function of the monitor code. As described above, the preferred embodiment of the present invention generates monitor code in a high level language. It is more efficient to simulate high level language code than it is to simulate low level language code. Therefore, the monitor code receives the output of latches 102, 104, and 106 as inputs and combines these to create statements that are logically equivalent to the signals present on NODE 1, NODE 2, NODE 3, and NODE 4.

Continuing with FIG. 4, an output of an AND gate 402 generates the signal PATH FIRED. A first and a second input of AND gate 402 receive the signals BEFORE and AFTER, respectively. The signal BEFORE corresponds to a high logic level if and only if the signals present on NODE 1, NODE 2, NODE 3, and NODE 4 prior to a particular clock transition were logically equivalent to the values specified by the timing tool prior to the speed path firing. Similarly, the signal AFTER corresponds to a high logic level if and only if the signals present on NODE 1, NODE 2, NODE 3, and NODE 4 after a particular clock transition are logically equivalent to the values specified by the timing tool.

An output of a latch 404 generates the signal BEFORE. An input of latch 404 is connected to an output of an N-input AND gate 406, where N is an integer equal to the number of nodes in the speed path. The N-inputs to AND gate 406 are connected to a differing one of the N nodes: NODE 1, NODE 2, NODE 3, and NODE 4. If the timing tool specifies that a particular node transitions from low-to-high, then that node is inverted by an inverter prior to connection to AND gate 406. In the depicted example, the TIMING PATH depicted in FIG. 2 occurs when (1) NODE 1 transitions low-to-high, (2) NODE 2 transitions high-to-low (3) NODE 3 transitions high-to-low, and (4) NODE 4 transitions low-to-high. Therefore, the signals present in NODE 1 and NODE 4 are inverted by inverters 408 and 410, respectively.

An output of an N-input AND gate 412 generates the signal AFTER. The N-inputs to AND gate 412 are connected to a differing one of the N nodes: NODE 1, NODE 2, NODE 3, and NODE 4. If the timing tool specifies that a particular node transitions from high-to-low, then that node is inverted by an inverter prior to connection to AND gate 412. In the depicted example, the signals present in NODE 2 and NODE 3 are inverted by inverters 414 and 416, respectively.

An output of a latch 418 generates the signal STICKY PATH FIRED. Latch 418 asserts STICKY PATH FIRED coincident with AND gate 402 asserting PATH FIRED and continues to so assert the signal until reset. The signal STICKY PATH FIRED is useful when simulation results are not reviewed on a cycle by cycle basis, but rather at the end of the simulation. An input to latch 418 is connected to an output of an OR gate 420. A first input and a second input of OR gate 420 is connected to the signal PATH FIRED and to the signal STICKY PATH FIRED, respectively.

Figure 5:
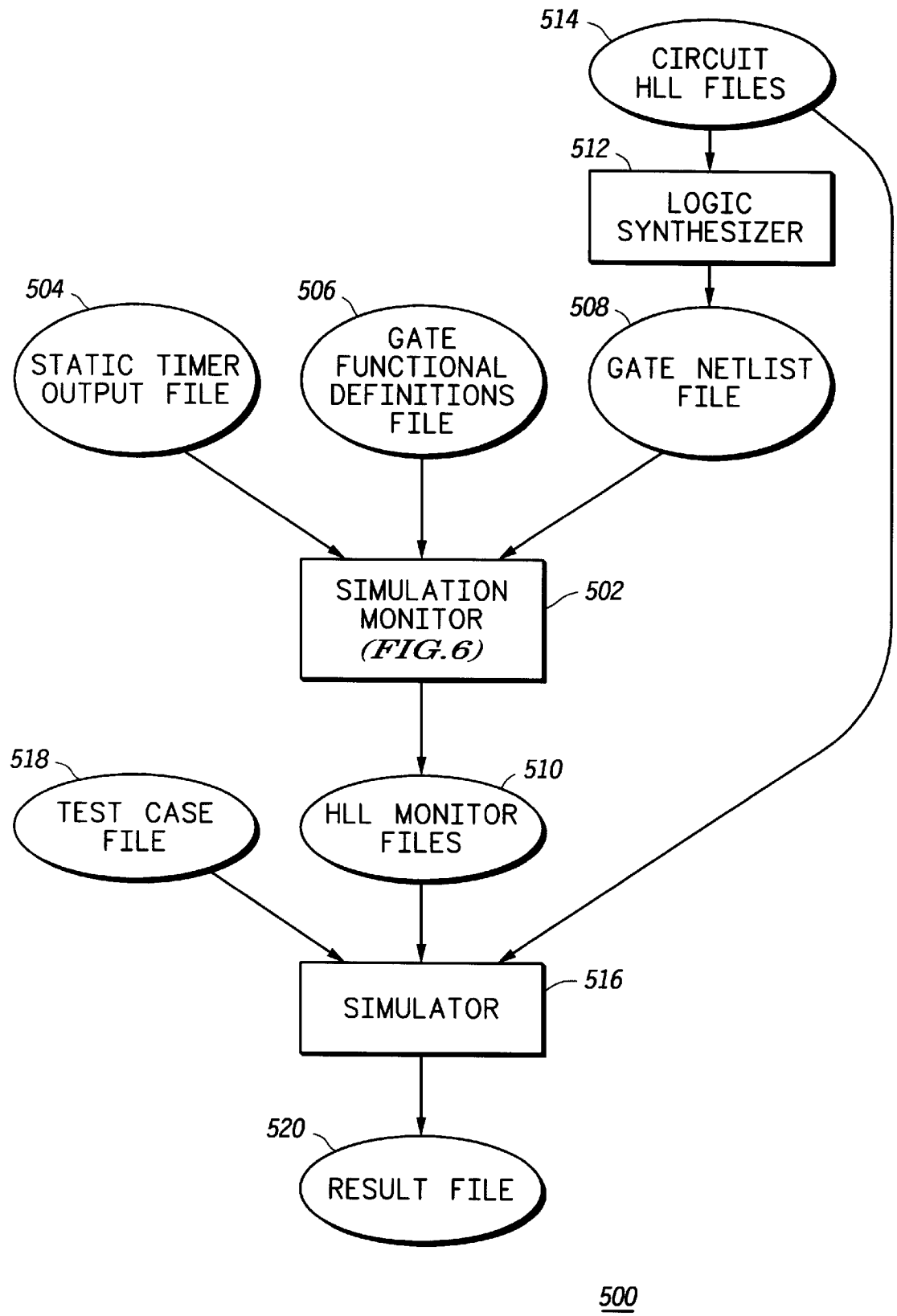
FIG. 5 is a block diagram depicting the methodology of one embodiment of the present invention.

FIG. 5 is a block diagram depicting the methodology 500 of one embodiment of the present invention. According to methodology 500, a simulation monitor 502 receives three input files, a static timer output file 504, a gate functional definitions file 506, and a gate netlist file 508 and generates a set of output files, labeled HLL (high level language) monitor files 510. The static timer output files 504 specify the speed paths of interest to simulation monitor 502. Therein, each path is specified as a set of nodes in a particular order along with the transition for each node that causes the path to be a speed path. The gate functional definitions file 506 specifies the output of each gate in gate netlist file 508 as a Boolean function of the gate's inputs. Gate netlist file 508 is a low level language instantiation of electrical circuit 100. Gate netlist file 508 is generated by a logic synthesizer 512 from circuit HLL files 514. HLL monitor files 510 contain two separate files, a logic monitor file and a timing paths file. Simulation monitor 502 is more fully described below in connection with FIG. 6.

A simulator 516 receives the HLL monitor files 510, a test case file 518, and the circuit HLL files 514. Simulator 516 applies the input signals specified in test case file 518 to the circuit models in HLL monitor files 510 and to circuit HLL files 514. Simulator 516 then calculates the resultant output signals and stores these in a result file 520. Later, a designer can inspect the result file 520 to see that the circuit HLL files produced proper outputs and whether or not the firing equations from HLL monitor files 510 fired or not.

The methodology depicted in FIG. 5 is a subset of an overall semiconductor design process. Once a static timing analyzer identifies speed paths in a design, the design can be modified accordingly and retested to determine if it complies with timing requirements. Typically, this is an iterative process. Later, the designer generates a set of lithographic plates which contain geometric representations of the design suitable for manufacture according to a desired semiconductor technology. After manufacture, the designer applies the same test vectors that triggered the firing equations during simulation to the completed circuit. The designer can efficiently probe each problem area to confirm his timing model assumptions and design choices.

Figure 6:
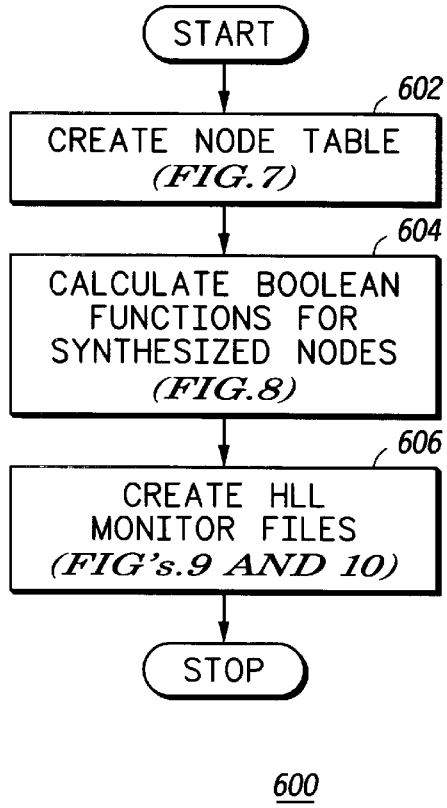
FIG. 6 is a flow chart depicting the simulation monitor illustrated in FIG. 5.

FIG. 6 is a flow chart 600 depicting simulation monitor 502 illustrated in FIG. 5. Simulation monitor 502 first creates a node table in a step 602. The node table contains at least four separate data structures useful in the generation of a firing equation. Step 602 is more fully described below in connection with FIG. 7. Next, simulation monitor 502 calculates the Boolean function for certain nodes in circuit 100, a step 604. It is only necessary to calculate the Boolean function for those nodes specified by the timing tool as part of a speed path which are also synthesized by logic synthesizer 512. The resulting Boolean functions are expressed in terms of variables present in the high level language description of circuit 100: the outputs of latches, primary inputs to circuit 100, and outputs of design macros. It is not necessary to calculate the Boolean function of nodes which are not synthesized. By construction, non-synthesized nodes are already expressed in terms of variables present in the high level language description. The Boolean functions created in step 604 are stored in the node table created in step 602. Step 604 is more fully described below in connection with FIG. 8. Finally, simulation monitor 502 creates the HLL monitor files 510, in a step 606, by combining the calculated Boolean functions according to the timing paths specified in static timing output file 504. Step 606 is more fully described below in connection with FIGS. 9 and 10.

Figure 7:
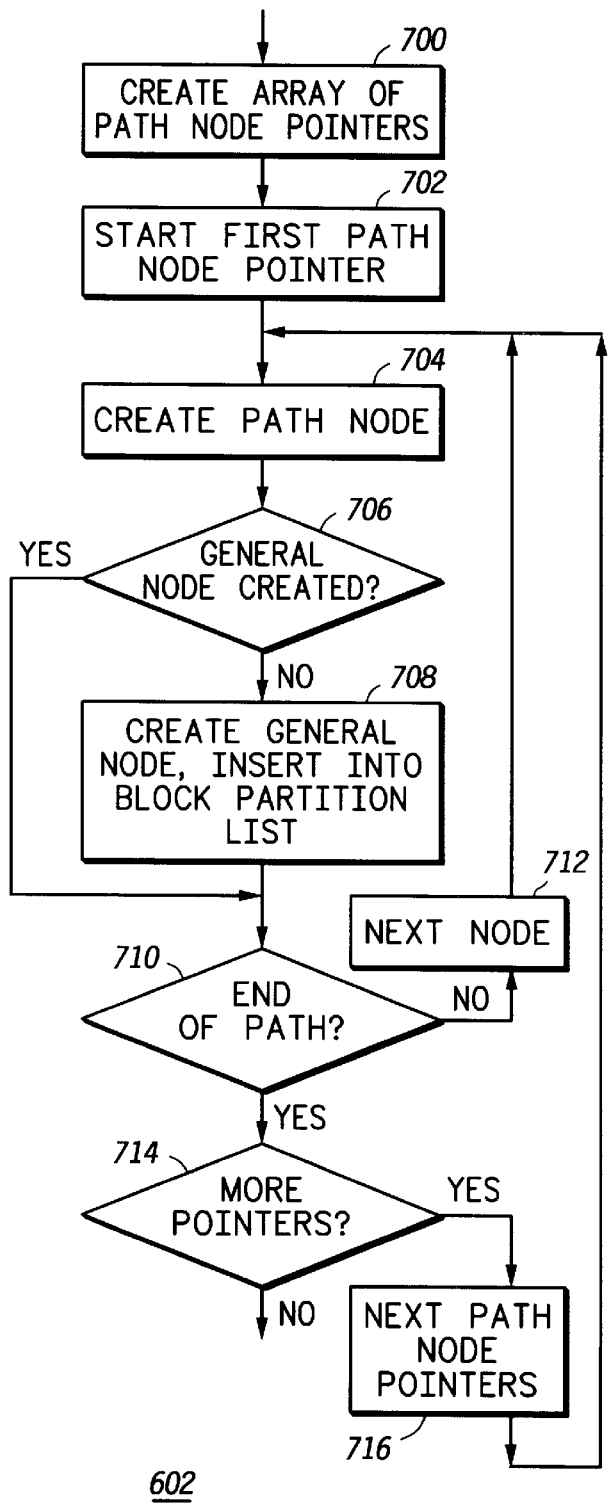
FIG. 7 is a flow chart depicting a step of the method illustrated in FIG. 6.

FIG. 7 is a flow chart depicting step 602 of the method illustrated in FIG. 6. As described above, step 602 generates four data structures that are useful in the generation of firing equations: (1) an array of path node pointers, (2) a list of path nodes, (3) a list of general nodes, and (4) an array of block partition lists. Simulation monitor 502 populates the various data structures by sequentially stepping through the paths and, within a single path, by sequentially stepping through the path nodes.

In a step 700, simulation monitor 502 allocates memory for each timing path by creating the array of path node pointers. The array of path node pointers is a list of pointers to the first node in each timing path. The static timing tool identifies each timing path and the constituent path nodes in each:

Path Node Pointer Array:
  Pointer 1
  Pointer 2:
  Pointer Last

Simulation monitor 502 then reads and parses each timing path. First, simulation monitor 502 initializes itself to the first path node of the first path, a step 702. Next, simulation monitor 502 reads the corresponding node from static timer output file 504 gate netlist file 508 and writes certain information about the node into the list of path nodes. Simulation monitor 502 stores the first path node in each path at the memory location identified by the corresponding Path Node Pointer. Subsequent path nodes are connected in a linked list by pointers. Each node in a timing path has a unique entry in the path node array:

Path Node Array Entry:
  Transition
  Path Id
  Next Node Pointer
  General Node Array Pointer The Transition field indicates whether the node transitions from low-to-high or from high-to-low when the node is in the timing path, "Path Id." The Next Node Pointer field points to the next node in the timing path indicated by Path Id. Later, simulation monitor 502 will build the timing path by following the virtual chain created by the sequential Next Node Pointers. The last node in each path contains a special character(s) in the Next Node Pointer field to indicate the end of the path node list. The General Node Array Pointer field points to an entry in the General Node List containing more information about the node. Each node may be a member of any number of timing paths. The information contained in the Path Node List relates to a particular timing path. The information contained in the General Node List relates to the node whenever it appears in a timing path.

In a step 706, simulation monitor 502 determines if it has already created an entry in the General Node List for the current path node. If simulation monitor 502 has not created such an entry, then it creates one, a step 708. Each path node entry contains certain pertinent information about the node from gate netlist file 508:

General Node List Entry:
  Name
  (Reserved for Boolean function)
  Type
  Block
  Synthesize/Unsynthesized
  Path List The Name field identifies the node within gate netlist file 508. The Type field identifies the general category of gate;

NAND gate, inverter, etc. The Block field identifies the block of which the node is a member. Typically, the block information is extracted from the name of the node itself. The Synthesized/Unsynthesized field indicates whether logic synthesizer 512 generated the node (synthesized) or whether the node was already expressed in terms of variables recognized by the high level language (unsynthesized). This information is usually related to which design block the node is situated. The Path List field(s) identifies the paths of which each particular node is a member.

In step 708, simulation monitor 502 also adds a pointer to the General Node in the Block Partition of which the node is a member. By construction, each node will be a member of one and only one block partition. Each block partition, however, can contain numerous nodes:

Block Partition Array
  Block Partition A
    Node Pointer 1
    Node Pointer 4:
    Node Pointer Last
  Block Partition B
    Node Pointer 2
    Node Pointer 3:
    Node Pointer Last:
    Block Partition Last
      Node Pointer 200
      Node Pointer 201:
      Node Pointer Last
  End of Block Partition Array If simulation monitor 502 has already created an entry in the General Node Array, then it need not do so again. In either case, simulation monitor 502 determines if it has reached the end of the current path, a step 710. If there remain path nodes to process in the current path, then simulation monitor reads the next node in the current timing path from the static timer output file 504, a step 712, and returns to step 704 to continue node processing. If there are no more path nodes to process, then simulation monitor 502 determines if there are any more paths to process, a step 714. If there are more paths to process, then simulation monitor 502 reads the next path node, a step 712, and also returns to step 704 to continue node processing. If there are no more paths to process, then simulation monitor 502 continues in FIG. 8.

In the described embodiment, node information is separated into partitions which parallel the division into blocks of the underlying circuit. This separation facilitates file management. Other embodiments need not partition the node table structure.

Figure 8:
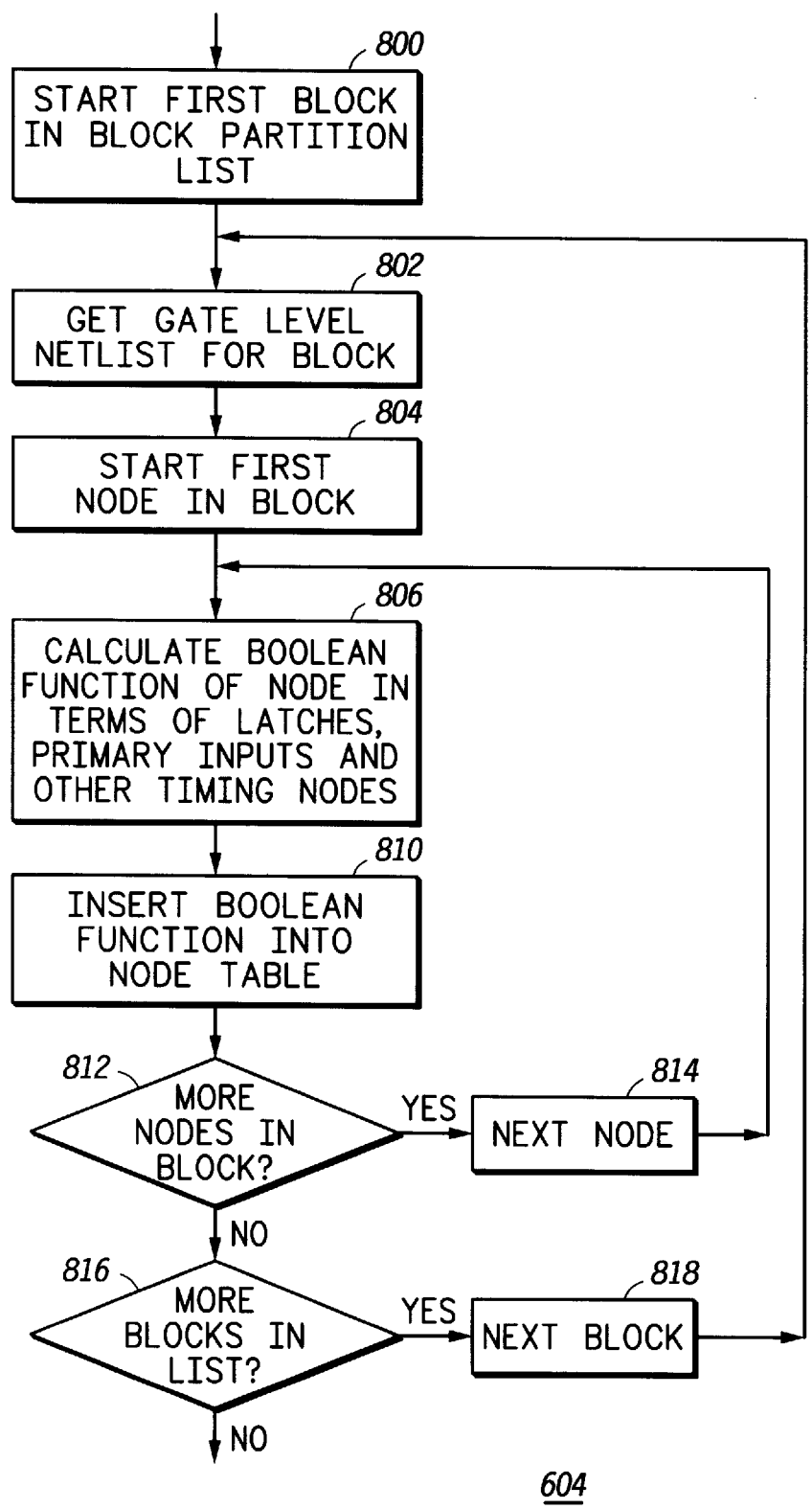
FIG. 8 is a flow chart depicting a step of the method illustrated in FIG. 6.

FIG. 8 is a flow chart depicting step 604 of the method illustrated in FIG. 6. In step 604, simulation monitor 502 determines the Boolean function of each node in terms of variables present in the high level language description of circuit 100. Simulation monitor 502 stores the Boolean function for each node in the node's General Path Node entry.

In a step 800, simulation monitor 502 initializes itself to the first block in the Block Partition list. Next, simulation monitor 502 accesses the gate level netlist for the current block. Simulation monitor 502 will need all or some of this information to calculate the Boolean functions of each node. As described above, the name of each node contains an embedded reference to the block of which it is a member. Simulation monitor 502 initializes itself to the first path node in the current block partition by reading the first Node Pointer, a step 804. The first Node Pointer will point back to the General Node list entry for the node.

Next, simulation monitor 502 recursively calculates the Boolean function for the current node by reading its Type and logically combining its gate level netlist inputs as specified for the Type, a step 806. If the inputs to the node are not themselves expressed in terms of high level language variables or other Path Nodes, then simulation monitor will continue to access the block partition gate netlist information (Type and inputs) for the nodes until all variables are so expressed. In a step 810, simulation monitor 502 inserts the final Boolean function into the reserved field of the node's General Node list. Simulation monitor 502 determines if it has reached the end of the current block partition, a step 812. If there remain path nodes to process in the current block partition, then simulation monitor 502 reads the next node in the current block partition, a step 814, and returns to step 806 to continue processing. If there are no more path nodes to process, then simulation monitor 502 determines if there are any more block partitions to process, a step 816. If there are more block partitions to process, then simulation monitor 502 initializes itself to the next block in the Block Partition list, a step 818, and returns to step 802 to continue processing. If there are no more block partitions to process, then simulation monitor 502 continues in FIG. 9.

Figure 9:
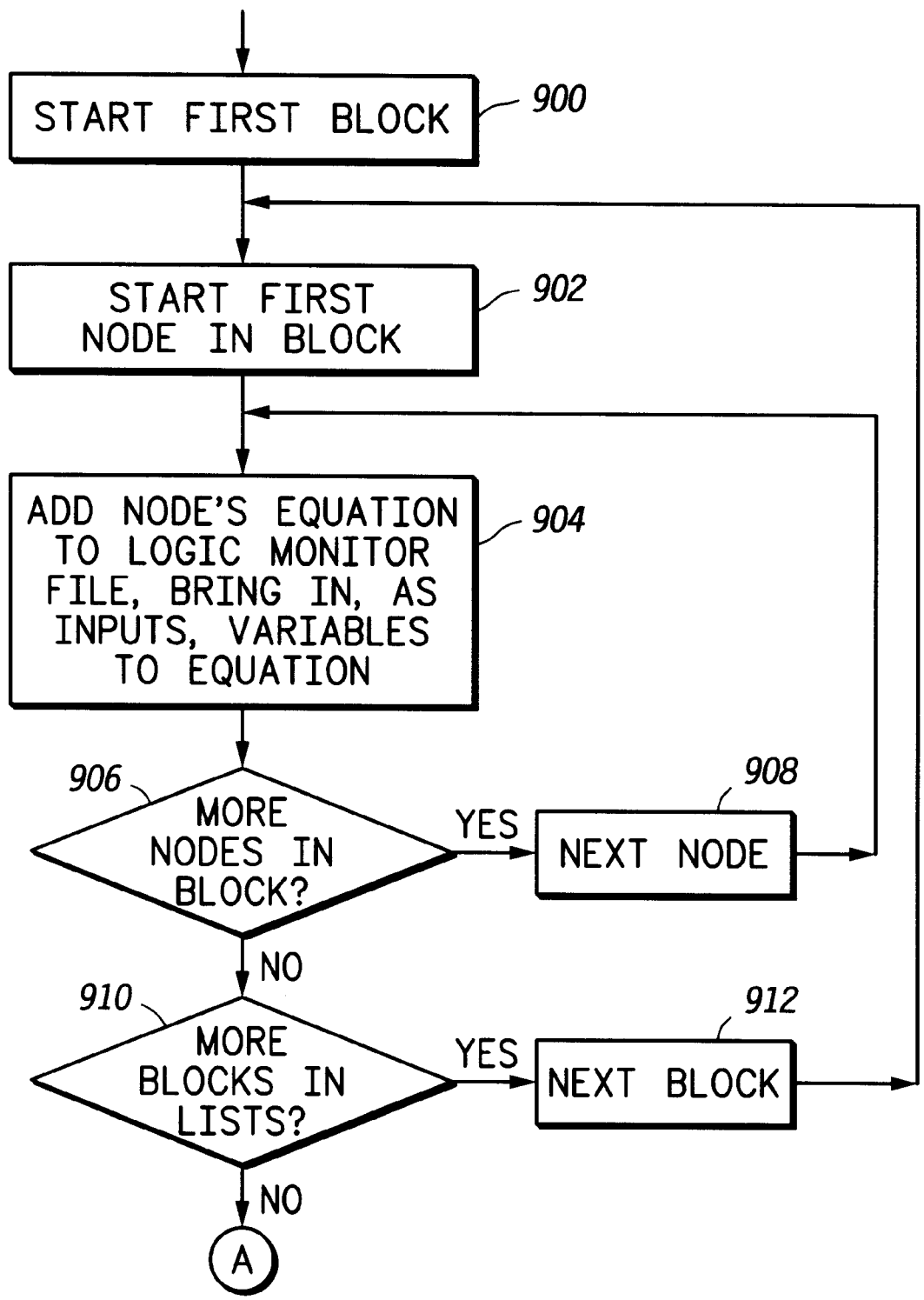
FIGS. 9 and 10 are flow charts depicting a step of the method illustrated in FIG. 6.
Figure 10:
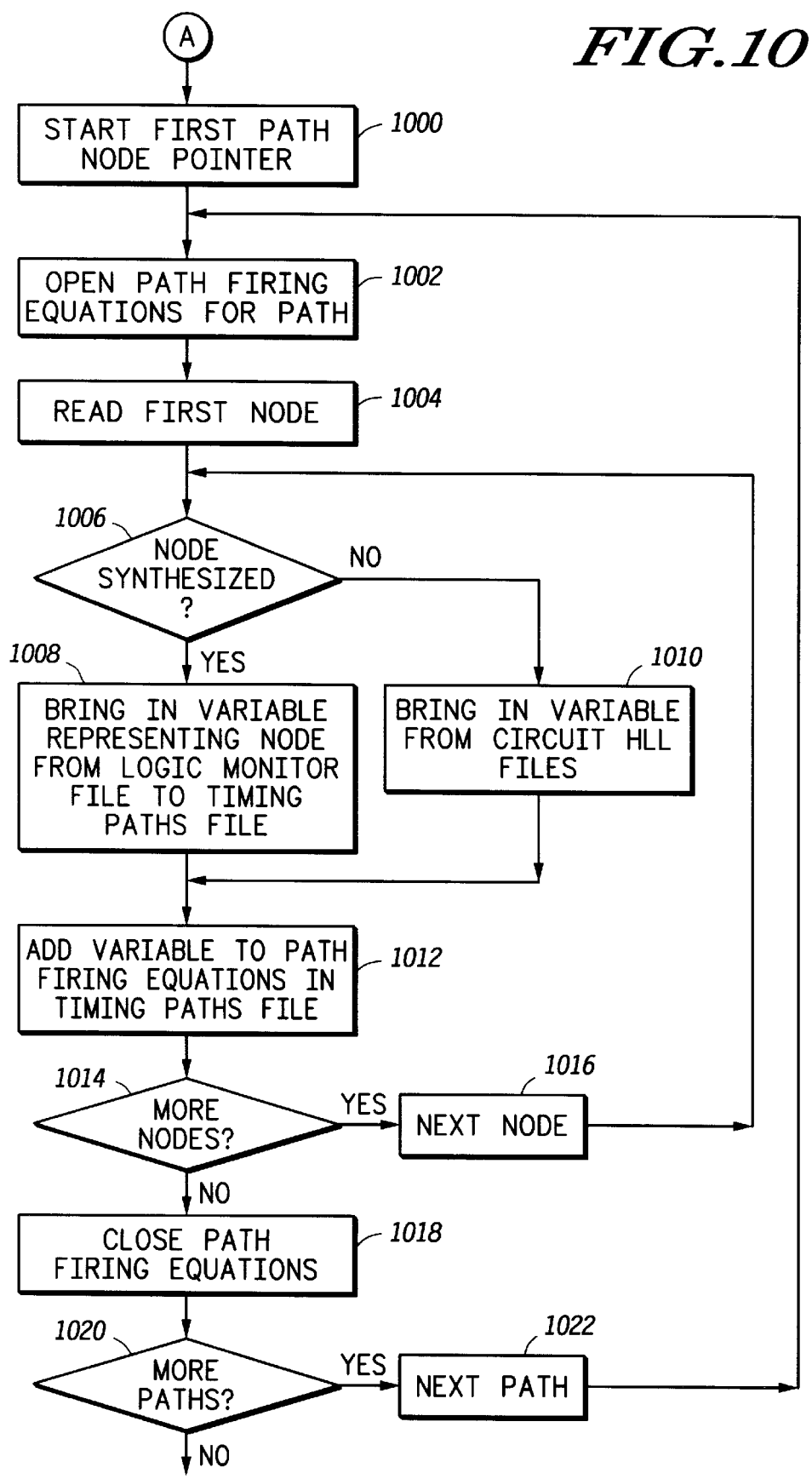

FIGS. 9 and 10 are flow charts depicting step 606 of the method illustrated in FIG. 6. As described above, simulation monitor 502 creates the HLL monitor files 510 in step 606, by combining the calculated Boolean functions according to the timing paths specified in static timing output file 504. HLL monitor files 510 contain two separate files, a logic monitor file and a timing paths file. FIG. 9 depicts the generation of the logic monitor file. FIG. 10 depicts the generation of the timing paths file.

Continuing with FIG. 9, simulation monitor 502 populates the logic monitor file with the Boolean function of each path node and the function inputs. Simulation monitor 502 processes each path node by sequentially stepping through the block partitions and, within a single block partition, by sequentially stepping through all of the path nodes. In a step 900, simulation monitor 502 initializes itself to the first block in the Block Partition list. Next, simulation monitor 502 initializes itself to the first path node in the current block partition by reading the first Node Pointer, a step 902. The first Node Pointer will point back to the General Node list entry for the node. Simulation monitor 502 then adds the Boolean function of the node to the logic monitor file and brings in the inputs to the functions as inputs to the logic monitor file a step 904. Simulation monitor 502 determines if it has reached the end of the current block partition, a step 906. If there remain path nodes to process in the current block partition, then simulation monitor 502 reads the next node in the current block partition, a step 908, and returns to step 904 to continue processing. If there are no more path nodes to process, then simulation monitor 502 determines if there are any more block partitions to process, a step 910. If there are more block partitions to process, then simulation monitor 502 initializes itself to the next block in the Block Partition list, a step 912, and returns to step 902 to continue processing. If there are no more block partitions to process, then simulation monitor 502 continues in FIG. 10.

Continuing with FIG. 10, simulation monitor 502 populates the timing paths file with the path firing equations corresponding to the various timing paths identified by static timer output file 504. Simulation monitor 502 processes each timing path by sequentially stepping through the array of Path Node Pointers and, within a single path, by sequentially stepping through the path nodes. In a step 1000, simulation monitor 502 initializes itself to the first timing path by reading the first Path Node Pointer. Next, simulation monitor 502 opens the firing equation for the current path, a step 1002:

Firing Equations:
Before=
After=

In a step 1004, simulation monitor 502 reads the Path Node entry and General Node entry for the current path node. Simulation monitor 502 determines if the current node is synthesized, a step 1006. If the current path node is synthesized, then simulation monitor 502 brings in the variables from the high level language description of circuit 100 upon which the Boolean function depends. Simulation monitor 502 also brings in the single variable representing the node, itself, from the logic monitor file for the block in which the node is located. If the current path node is not synthesized, then simulation monitor 502 brings in the variables stored in circuit high level language files 514, a step 1010. In either case, simulation monitor 502 adds the node's Boolean equation to the firing equations in the polarity specified by the node's Transition field, a step 1012.

In the example illustrated in FIGS. 2 and 4, NODE 1 is part of the timing path when it transitions from low-to-high. Therefore, in step 1012 simulation monitor 502 adds the logical complement of the variable representing NODE 1, !EQ1, to the equation BEFORE, and adds the non-inverted Boolean equation, EQ1, to the equation AFTER, where "!" indicates the logical complement of a variable:

Firing Equations:
Before=!EQ1
After=EQ1

Simulation monitor 502 determines if it has reached the end of the current timing path, a step 1014. If there remain path nodes to process in the current path, then simulation monitor reads the next node in the current timing path from the static timer output file 504, a step 1016, and returns to step 1006 to continue node processing. Continuing with the example illustrated in FIGS. 2 and 4, NODE 2 and NODE 3 are part of the timing path when each transitions from high-to-low. NODE 4 is part of the timing path when it transitions from low-to-high. The firing equations contain the variables representing all nodes in the timing path in the proper polarity after all nodes are processed:

Firing Equations:
Before=!EQ1&EQ2&EQ3&!EQ4
After=EQ1&!EQ2&!EQ3&!EQ4

Returning to step 1014, if there are no more path nodes to process, then simulation monitor 502 closes the Firing Equations, a step 1018. In the present timing path example, simulation monitor 502 instantiates a latch in the high level language to delay the signal BEFORE one cycle, and logically ANDs the delayed signal with the signal AFTER:

Firing Equations (Timing Path):
Before=!EQ1&EQ2&EQ3&!EQ4
After=EQ1&!EQ2&!EQ3&!EQ4
Latch Module: Latch Before
  IN: Before
  OUT: Before Delayed
Path Fired=Before Delayed&After In other embodiments, the Path Fired signal may be synthesized to trigger under different circumstances. For instance, it may be desirable to monitor any transition along a certain path. In this latter case, the Path Fired equation would fire if and only if every node transitioned (either high-to-low or low-to-high) across a clock boundary:

Firing Equations (Any Transition Through The Path):
Latch Module: Latch NODE 1
  IN: NODE 1
  OUT: NODE 1 Delayed
Latch Module: Latch NODE 2
  IN: NODE 2
  OUT: NODE 2 Delayed
Latch Module: Latch NODE 3
  IN: NODE 3
  OUT: NODE 3 Delayed
Latch Module: Latch NODE 4
  IN: NODE 4
  OUT: NODE 4 Delayed
NODE 1 FIRE=NODE 1 XNOR NODE 1 Delayed
NODE 2 FIRE=NODE 2 XNOR NODE 2 Delayed
NODE 3 FIRE=NODE 3 XNOR NODE 3 Delayed
NODE 4 FIRE=NODE 4 XNOR NODE 4 Delayed
Path Fired=NODE 1 FIRE & NODE 2 FIRE & NODE 3 FIRE & NODE 4 FIR After closing the firing equations, simulation monitor 502 determines if there are any more paths to process, a step 1020. If there are more paths to process, then simulation monitor 502 reads the next Path Node Pointer from the Path Node Pointer list, a step 1022, and returns to step 1002 to continue node processing. If there are no more paths to process, then simulation monitor 502 has completed generating the path firing equations.

Figure 11:
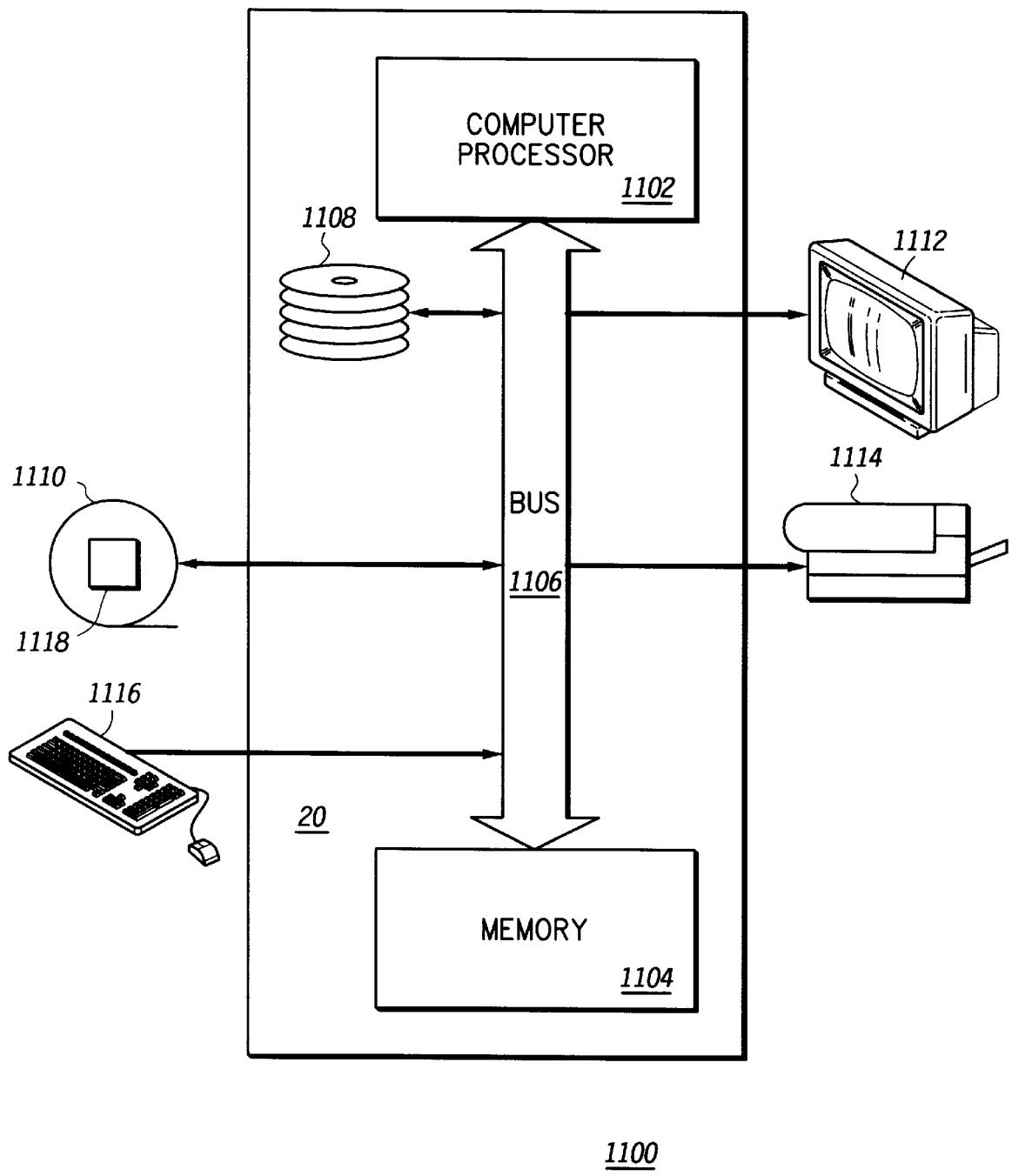
FIG. 11 is a block diagram of a system within which the present invention may be implemented.

FIG. 11 is a block diagram of a system 1100 within which the present invention may be implemented. System 1100 has a computer processor 1102 and a memory 1104, connected by a bus 1106. Memory 1104 is a relatively high speed machine-readable medium and includes volatile memories such as dynamic random access memory ("DRAM"), and static random access memory ("SRAM"), and non-volatile memories such as, read only memory ("ROM"), electrically programmable ROM ("EPROM"), electrically erasable/programmable ROM ("EEPROM"), and bubble memory. Also connected to the bus are a secondary storage subsystem 1108, an external storage subsystem 1110, output devices such as a monitor 1112 and a printer 1114, and input devices such as a keyboard (with mouse) 1116. Secondary storage subsystem 1108 includes machine-readable media such as hard disk drives, magnetic drum, and bubble memory. External storage subsystem 1110 includes machine-readable media such as floppy disks, removable hard drives, magnetic tape, CD-ROM, and even other computers, possibly connected via a communications line. It should be appreciated that there is substantial functional overlap between these latter two subsystems.

Computer software 1118, including simulation monitor 502, logic synthesizer 512, simulator 516, and a static timer, can be stored in various media within system 1100. Such media include memory 1104, secondary storage subsystem 1108, and external storage subsystem 1110. Similarly data, including static timer output file 504, gate functional definitions file 506, gate net list file 508, HLL monitor files 510, circuit HLL files 514, test case file 518, and result file 520, can be stored in the same various media. Because the apparatus implementing the present invention is, for the most part, composed of electronic components and circuits known to those skilled in the art, and in order not to obfuscate or distract from the teachings of the present invention, circuit details will not be explained in any greater detail.

The disclosed invention has been described as a software program operable on any general purpose computer. In another embodiment, the high level language monitor code depicted in FIG. 3 may be instantiated in a field programmable gate array ("FPGA") hardware emulator. Quickturn Inc. offers such an emulator. In a hardware emulator, the functional equivalent of an electronic design is programmed into an array of gates. The hardware emulator then functions like the designed circuit in every respect, excluding size and maximum operating frequency. Test vectors can be applied to the inputs of the emulator and outputs collected for analysis. In this alternate embodiment, the monitor code could also be programmed into the array. In this case, a physical electronic circuit would generate the Path Fired signals.

Those skilled in the art will recognize that modifications and variations can be made without departing from the spirit of the invention. Therefore, it is intended that this invention encompass all such variations and modifications as fall within the scope of the appended claims.

What is claimed is:

1. A method of monitoring a computer simulation of an electrical circuit, the method comprising the steps of:
   analyzing a timing analyzer output to select an electrical path and specified transitions on the nodes of the electrical path, wherein an electrical path is an interconnected set of circuit nodes within the electrical circuit and having specified transitions occurring at each circuit node of the set of circuit nodes;
   calculating a logical expression in the syntax of a first computer language of each node of the set of circuit nodes in the electrical path as a function of existing expressions in the first computer language description of the electrical circuit;
   creating a node table containing, for each node of the set of circuit nodes in the electrical path, a node description including the calculated logical expression for that node, and pointers indicating the connectivity of that node with one or more nodes in the electrical path;
   generating one or more monitor files in the first computer language, wherein at least one of the monitor files contains path firing equations to indicate when the specified transition for every node in the electrical path is exercised, and wherein at least one of the monitor files contains the logical expression for each of the nodes in the electrical path.

2. A method according to claim 1, wherein the path firing equations are generated by accessing the node table to determine the transition on each node in the electrical path and creating an expression which will be true before the nodes take the specified transition and a second expression which will be true after the nodes take the specified transition, and a third expression which will be true when the first expression is true and one time step later the second expression is true.

3. A method according to claim 1, further comprising the step of executing in parallel a first computer language model of the electrical circuit and the plurality of monitor files, wherein the executing monitor files detect when the selected electrical path is exercised during execution of the first computer language model of the electrical circuit.

4. A method according to claim 1, further comprising the step of parsing a gate level model of the electrical circuit.

5. A method according to claim 1, wherein the node table further includes a transition for each node in the electrical path.

6. A method according to claim 1, wherein the electrical path is a timing path.

7. A method according to claim 1, further comprising the step of generating the gate level model by synthesizing a high level language model of the electrical circuit.

8. A method according to claim 1, wherein a plurality of electrical paths are being monitored and the step of analyzing the timing analyzer output includes determining the plurality of electrical paths and specified transitions within the electrical paths and wherein the step of creating a node table includes creating an array of pointers indicating each path of the plurality of paths.

9. A method according to claim 1, wherein the logical expression is a Boolean expression.

10. A method according to claim 1, wherein the first computer language is a High-Level Language (HLL).

11. A method of monitoring a computer simulation in a first computer language of an electrical circuit, the method comprising the steps of:
    generating HLL monitor code that indicates when selected transitions occur at selected nodes along a selected electrical path within the electrical circuit during a first computer language simulation of the electrical circuit, wherein the first computer language monitor code receives, as an input, a signal of a first computer language simulation of the electrical circuit; and
    executing the first computer language monitor code during a first computer language simulation of the electrical circuit, wherein the input is generated from the first computer language simulation of the electrical circuit;
    programming a programmable logic array to implement a circuit that performs the indication of the first computer language monitor code.

12. A method according to claim 11, wherein the first computer language monitor code receives as an input the simulated output of each of a plurality of latches in the electrical circuit.

13. A method according to claim 11, wherein the selected electrical path is a timing path within the electrical circuit that is determined to have the longest delay of a plurality of timing paths within the electrical circuit.

14. A article of manufacture for use in a computer system for monitoring a computer simulation in of an electrical circuit comprising a computer usable medium having computer readable program code means for:
    selecting an electrical path and specified transitions on the nodes of the electrical path, wherein an electrical path is an interconnected set of circuit nodes within the electrical circuit and having specified transitions occurring at each circuit node of the set of circuit nodes;
    calculating a logical expression in the syntax of a first computer language of each node of the set of circuit nodes in the electrical path as a function of existing expressions in the first computer language description of the electrical circuit;
    creating a node table containing, for each node of the set of circuit nodes in the electrical path, a node description including the calculated logical expression for that node, a specified transition for that node, and pointers indicating the connectivity of that node with one or more nodes in the electrical path;
    generating one or more monitor files in the first computer language, wherein at least one of the monitor files contains path firing equations to indicate when the specified transition for every node in the electrical path is exercised, and wherein at least one of the monitor files contains the logical expression for each of the nodes in the electrical path.

15. An article of manufacture according to claim 14, wherein the path firing equations are generated by accessing the node table to determine the transition on each node in the electrical path and creating an expression which will be true before the nodes take the specified transition and a second expression which will be true after the nodes take the specified transition, and a third expression which will be true when the first expression is true and one time step later the second expression is true.

16. An article of manufacture according to claim 14, further comprising means for detecting when the selected electrical path is exercised during execution of a first computer language model of the electrical circuit.

17. An article of manufacture according to claim 14, wherein the node table further includes a transition for each node in the electrical path.

18. An article of manufacture according to claim 14, including means for generating the gate level model by synthesizing a high level language model of the electrical circuit.

19. An article of manufacture according to claim 14, wherein the first computer language is a High-Level Language (HLL).

* * * * *